United States Patent
Li et al.

(10) Patent No.: US 6,717,850 B1
(45) Date of Patent: Apr. 6, 2004

(54) EFFICIENT METHOD TO DETECT PROCESS INDUCED DEFECTS IN THE GATE STACK OF FLASH MEMORY DEVICES

(75) Inventors: Jiang Li, San Jose, CA (US); Nian Yang, San Jose, CA (US); Zhigang Wang, Santa Clara, CA (US); John Jianshi Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/313,676

(22) Filed: Dec. 5, 2002

(51) Int. Cl.[7] .................... G11C 16/04; G11C 16/06
(52) U.S. Cl. .................... 365/185.09; 365/185.18; 365/185.29; 365/185.33
(58) Field of Search ................ 365/185.09, 185.18, 365/185.29, 185.33

(56) References Cited

U.S. PATENT DOCUMENTS

| | | | |
|---|---|---|---|
| 5,862,081 A | | 1/1999 | Harari .................... 365/185.29 |
| 5,959,889 A | * | 9/1999 | Ratnakumar ........... 365/185.18 |
| 6,370,070 B1 | * | 4/2002 | Chevallier et al. ...... 365/185.09 |
| 6,396,742 B1 | * | 5/2002 | Korsh et al. ............ 365/185.29 |
| 6,510,081 B2 | * | 1/2003 | Blyth et al. ............. 365/185.18 |
| 6,631,086 B1 | * | 10/2003 | Bill et al. ............... 365/185.09 |
| 6,639,860 B2 | * | 10/2003 | Anzai ..................... 365/185.33 |

* cited by examiner

Primary Examiner—Trong Phan
(74) Attorney, Agent, or Firm—Eschweiler & Associates, LLC

(57) ABSTRACT

A method of processing a semiconductor device is disclosed and comprises applying a relatively high voltage across a gate stack of a flash memory cell for a certain period of time. Then, the polarity of the applied voltage is reversed and is again applied across the gate stack for another certain period of time. The voltage applied is greater than a channel erase voltage utilized for the memory cell. This applied voltage causes extrinsic defects to become amplified at interfaces of oxide/insulator layers of the gate stack. Then, the memory cell is tested (e.g., via a battery of tests) in order to determine if the memory cell is defective. If the cell is defective (e.g., fails the test), it can be assumed that substantial extrinsic defects were present in the memory cell and have been amplified resulting in the test failure. If the cell passes the test, it can be assumed that the memory cell is substantially free from extrinsic defects. Defective memory cells/devices can be marked or otherwise indicated as being defective.

22 Claims, 8 Drawing Sheets

EFFICIENT METHOD TO DETECT PROCESS INDUCED DEFECTS IN THE GATE STACK OF FLASH MEMORY DEVICES

FIELD OF THE INVENTION

The present invention generally relates to semiconductor processing, and more particularly relates to a method of detecting process induced defects in a gate stack of flash memory devices.

BACKGROUND OF THE INVENTION

Computers and electronic devices continue to become more and more powerful in terms of speed and expanding applications. These devices, as a result of being more powerful, also demand greater memory storage capacity to store data, such as digital audio, digital video, contact information, database data and the like. Also important for portable electronic and/or computer devices is the requirement that memory storage maintain its contents via a permanent storage device. Conventional desktop computer systems typically maintain information in permanent storage devices such as hard drives. However, portable devices, such as digital cameras, personal digital assistants, digital audio players, and the like, often do not employ those types of permanent storage devices for power, space, and weight reasons. Portable devices often must rely on their memory in order to store and maintain information or data.

Conventional desktop computer systems typically utilize volatile memory devices for temporary storage of programs and data, due to its high speed operation but rely on permanent storage devices such as hard drives for permanent or long term data storage. Volatile memory devices, such as, for example, random access memory (RAM), DRAM, SRAM and the like, require regular refresh cycles to maintain their information and fail to maintain that information once power is lost for a substantial amount of time. With respect to portable devices, volatile memory devices may meet the speed requirements, but generally fail to be feasible for portable devices due to volatile memory's inability to maintain data for substantial periods of time without power and/or refresh cycles.

Another type of memory device, in addition to volatile memory, is non-volatile memory. These devices maintain their information and/or data for substantial periods of time without refresh cycles and/or power and typically provide sufficient amounts of speed in operation. Because of these characteristics, non-volatile memory devices are often employed in portable electronic and/or computer devices.

A widely utilized type of non-volatile memory device is flash memory. Flash memory devices achieve relatively high speeds of operation and are able to maintain their data without power and/or refresh cycles. Flash memory devices are programmed and erased by pulses that place charges in selected memory cells or drain charges away. Additionally, blocks and arrays can be erased at a single time by an erase operation such as a channel erase.

Erase operations for flash memory devices are typically performed at greater voltage levels than those used in standard non-flash memory devices. Such erase operations can cause operation of flash memory devices and the devices themselves to be susceptible to extrinsic defects, introduced in the fabrication process, that would not generally be a problem for other types of memory devices. Costly and time intensive testing can be performed to identify devices with extrinsic defects, but such testing is not feasible and, therefore, the extrinsic defects are not necessarily identified. What is needed is a cost and time efficient method of identifying individual flash memory devices having extrinsic defects.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The present invention relates to a method of detecting process induced defects, also referred to as extrinsic defects, in the gate stack of flash memory devices and also to methods of fabricating flash memory devices that incorporate a high voltage stress test. By detecting these extrinsic defects, further processing of defective devices, meaning devices that have extrinsic defects, can be avoided resulting in significant cost and time savings. Traditional test mechanisms can fail to identify memory cells/devices with extrinsic defects as being defective.

The present invention applies a relatively high voltage across a gate stack of a flash memory cell for a certain period of time. Then, the polarity of the applied voltage is reversed and is again applied across the gate stack for another certain period of time. The voltage applied is greater than a channel erase voltage utilized for the memory cell during normal device operation. This applied voltage causes extrinsic defects to become amplified, for example, at interfaces of oxide/insulator layers of the gate stack. The memory cell is then tested (e.g., via a battery of tests) in order to determine if the memory cell is defective. If the cell is defective (e.g., fails the test), it can be assumed that substantial extrinsic defects were present in the memory cell and have been amplified resulting in the test failure. If the cell passes the test, it can be assumed that the memory cell is substantially free from extrinsic defects. Defective memory cells/devices can be marked or otherwise indicated as being defective thereby avoiding further parametric and/or functional testing of such defective devices.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
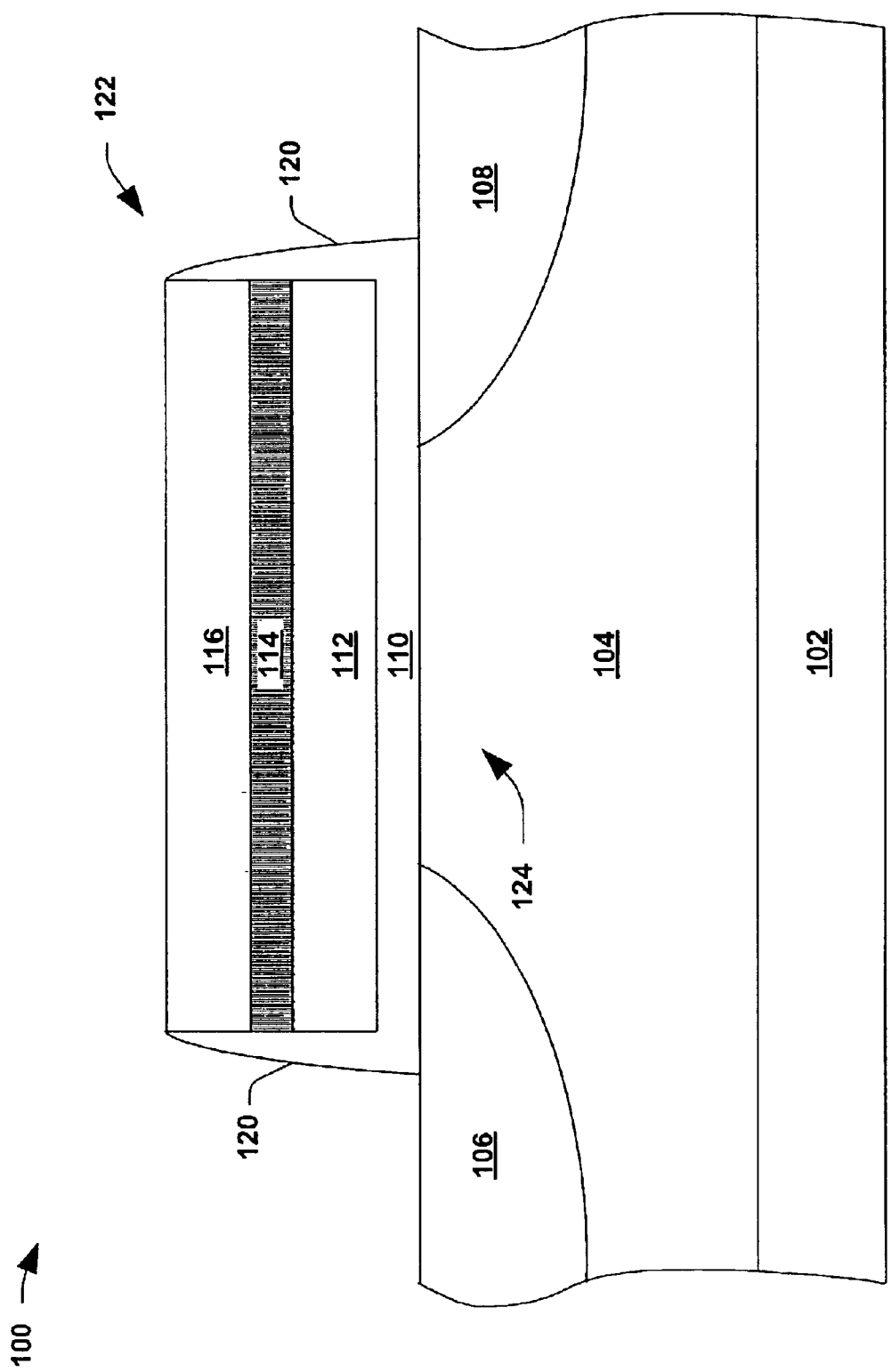
FIG. 1 is a cross sectional view of a flash memory cell in accordance with an aspect of the present invention.

The following is a detailed description of the present invention made in conjunction with the attached Figures, wherein like reference numerals will refer to like elements throughout. The present invention is directed to a method of detecting process induced defects in gate stacks of flash memory devices and thereby facilitating fabrication of flash memory devices without substantial process induced or extrinsic defects.

The present invention relates to a method of detecting process induced defects, also referred to as extrinsic defects, in the gate stack of flash memory devices and also to methods of fabricating flash memory devices that incorporate a high voltage stress test. By detecting these extrinsic defects, which were heretofore not generally feasible to detect, further processing and/or testing of defective devices, meaning devices that have extrinsic defects, can be avoided resulting in significant cost and time savings.

The present invention applies a relatively high voltage across a gate stack of a flash memory cell for a certain period of time. Then, the polarity of the applied voltage is reversed and is again applied across the gate stack for another certain period of time. The voltage applied is greater than a channel erase voltage utilized for the memory cell in normal device operation. If extrinsic defects are present in the memory cell, the applied voltage damages the memory cell. The damaged memory cell can easily be detected by a suitable flash memory test (e.g., channel erase, read, program, and the like).

FIG. 1 is a cross sectional view of an exemplary flash memory cell 100 in accordance with an aspect of the present invention. Although the memory cell 100 is illustrated in the present example, it should be understood that other flash cell structures may be employed and are contemplated as falling within the scope of the present invention. The flash memory cell 100 has been formed and screened for extrinsic defects via a defect detection method referred to as a high voltage stress test.

A p-type well 104 is formed in a lightly doped substrate 102 by doping or implanting a p-type dopant, such as boron, into the lightly doped substrate. To perform the doping/ implanting of the p-type well, a photoresist mask and/or an oxide mask can be utilized to selectively perform the doping, typically via ion implantation or diffusion. A photoresist mask is comprised of photoresist and can be employed for ion implantation by forming a photoresist mask on selected regions so as to prevent those selected regions from being doped during a subsequent ion implantation. After the implantation, the photoresist mask can be removed by a chemical agent. An oxide mask is comprised of oxide and can be employed for diffusion doping processes. Similar to the photoresist mask, an oxide mask is formed over selected regions so as to prevent diffusion of dopants into the selected regions. After diffusion, the oxide mask is removed via a suitable etch process.

A tunnel oxide 110 is formed over the substrate 102 covering at least a portion of the p-type well 104 and the active regions 106 and 108 via a suitable oxide deposition or growth process. The tunnel oxide 110 is formed so as to be a relatively thin oxide layer and can also be referred to as a gate oxide layer. The tunnel oxide 110 is thin enough to allow electrons to tunnel there through under appropriate biasing conditions. A floating gate 112 is formed on the tunnel oxide 110 and is comprised, for example, of polysilicon. The floating gate 112 is typically patterned and/or etched depending on a memory array configuration. An interlayer dielectric layer 114 is formed on the floating gate 112 to electrically isolate the floating gate 112. The interlayer dielectric layer 114 is typically comprised of an oxide-nitride-oxide (ONO) layer having two oxide layers sandwiching a nitride layer. A control gate 116 is formed on the interlayer dielectric layer 114 and also comprises, for example, polysilicon. The tunnel oxide 110, the floating gate 112, the interlayer dielectric layer 114, and the control gate 116 collectively define a stacked structure 122, also referred to as a gate stack. Sidewall spacers 120 are formed on sidewalls of the stacked structure 122. Source and drain regions 106 and 108 are then formed via implantation using the gate stack as a mask, thereby being self-aligned thereto. As a result of the above configuration of the memory cell 100, a channel 124 is located within the p-type well 104 between the source and drain regions 106 and 108 below the gate stack 122 The source region 106 and the drain region 108 are also referred to as active regions, are formed within the p-type well 104 by implanting an n-type dopant, such as antimony, arsenic, or phosphorous into the p-type well. Thus, the formed active regions 106 and 108 are n-type regions and have a higher dopant concentration than the p-type well 104.

The stacked structure 122 of FIG. 1 does not contain substantial extrinsic defects, which are processed induced defects, because the structure 122 has successfully passed a relatively high voltage stress test that identifies extrinsic defects not easily identifiable via conventional mechanisms. The high voltage stress test includes application of a high voltage (e.g., 20 volts) across a p-type well and a control gate of a flash memory cell (e.g., the p-type well 104 and the control gate 116 of the memory cell 100). Application of the high voltage exacerbates even minor extrinsic defects. Then, the cell is tested with standard testing techniques, such as programming and reading operations, in order to identify failure of the device. If a flash memory cell has extrinsic defects, those defects, after being amplified by the high voltage stress test, cause the flash memory cell to fail standard testing. It is important to note that a flash memory cell with extrinsic defects can, and often does, pass standard testing if the high voltage stress test of the present invention is not performed to amplify the defects. Additionally, it can be assumed that flash memory cells that do not fail after being subjected to the high voltage stress and testing can be considered to be substantially free from defects. A further description of this procedure is described infra.

The flash memory cell 100 operates in the following exemplary manner. The cell 100 is programmed by applying a relatively high voltage VG (e.g., approximately 10 volts) to the control gate 116 and connecting the source 106 to ground and the drain 108 to a predetermined potential above the source 106. These voltages generate a vertical and lateral electric field along the length of the channel 124 from the source to the drain. This electric field causes electrons to be drawn off the source 106 and begin accelerating toward the drain 108. As they move along the length of the channel 124, they gain energy. If they gain enough energy, they are able to jump over the potential barrier of the tunnel oxide 110 (tunnel therethrough) into the floating gate 112 and become trapped in the floating gate 112 since the floating gate 112 is surrounded by insulators (the interlayer dielectric layer 114 and the tunnel oxide 110). As a result of the trapped electrons in the floating gate 112, the threshold voltage of the cell 100 increases, for example, by about 2 to 5 volts. This change in the threshold voltage of the cell 100 created by the trapped electrons is what causes the cell to be programmed.

To read the memory cell 100, a predetermined voltage VG that is greater than the threshold voltage of an unprogrammed or erased cell, but less than the threshold voltage of a programmed cell, is applied to the control gate 116 with a voltage applied between the source 106 and the drain 108 (e.g., tying the source 106 to ground and applying about 1–2 volts to the drain 108). If the cell 100 conducts (e.g., about 50–100 milli-amps), then the cell 100 has not been programmed (the cell 100 is therefore at a first logic state, e.g., a zero "0"). Likewise, if the cell 100 does not conduct (e.g., considerably less current than 50–100 milli-amps), then the cell 100 has been programmed (the cell 100 is therefore at a second logic state, e.g., a one "1"). Consequently, one can read the cell current, for example, with a sense amplifier, to determine whether it has been programmed and thereby identify its logic state.

The flash memory cell 100 can be erased in a number of ways. In one arrangement, a voltage Vs (e.g., approximately 12–20 volts) is applied to the source 106 and the control gate 116 is held at a ground potential (VG=0), while the drain 108 is allowed to float. Under these conditions, a strong electric field develops across the tunnel oxide 110 between the floating gate 112 and the source 106. The electrons that are trapped in the floating gate undergo Fowler-Nordheim tunneling through the tunnel oxide 110 to the source 106. In another arrangement, applying a negative voltage on the order of minus 10 volts to the control gate, applying 5 volts to the source and allowing the drain to float can also erase a cell. In a further arrangement, referred to as a channel erase, applying a positive voltage (e.g., 9 volts) to the P-well and a negative voltage (e.g., −9 volts) to the control gate while allowing the source and drain to float erases a cell. The channel erase method of erasing flash memory cells can be particularly sensitive to extrinsic defects.

Figure 2:
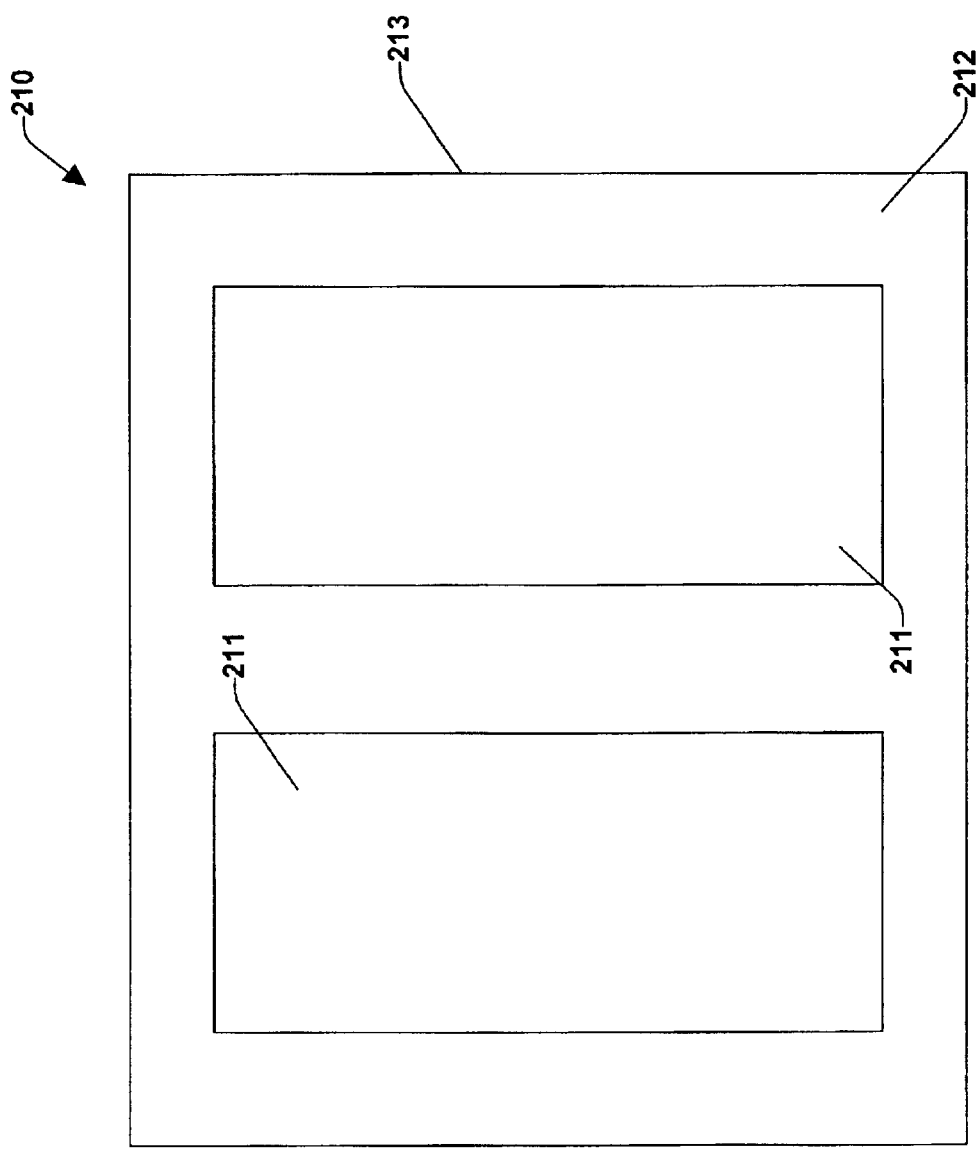
FIG. 2 is a plan view of a flash memory device in accordance with an aspect of the present invention.

Turning now to FIG. 2, a plan view of a flash memory device 210 in accordance with an aspect of the present invention is depicted. The flash memory device 210 comprises one or more high density core regions 211 and a low density peripheral portion 212 on a single substrate 213. The high density core regions 211 typically comprise at least one M×N array of individually addressable, substantially identical floating-gate (i.e., flash) type memory cells, such as the memory cell 100 of FIG. 1, and the low density peripheral portion 212 typically includes input/output (I/O) circuitry and circuitry for selectively addressing the individual cells (such as decoders for connecting the source, gate and drain of selected cells to predetermined voltages or impedances to affect designated operations of the cell such as programming, reading or erasing). The memory cells in the array have successfully passed the high voltage stress test discussed above, and therefore, are substantially without extrinsic defects. The memory cells within the core portion 211 are coupled together, for example, in a NOR-type circuit configuration.

Figure 3:
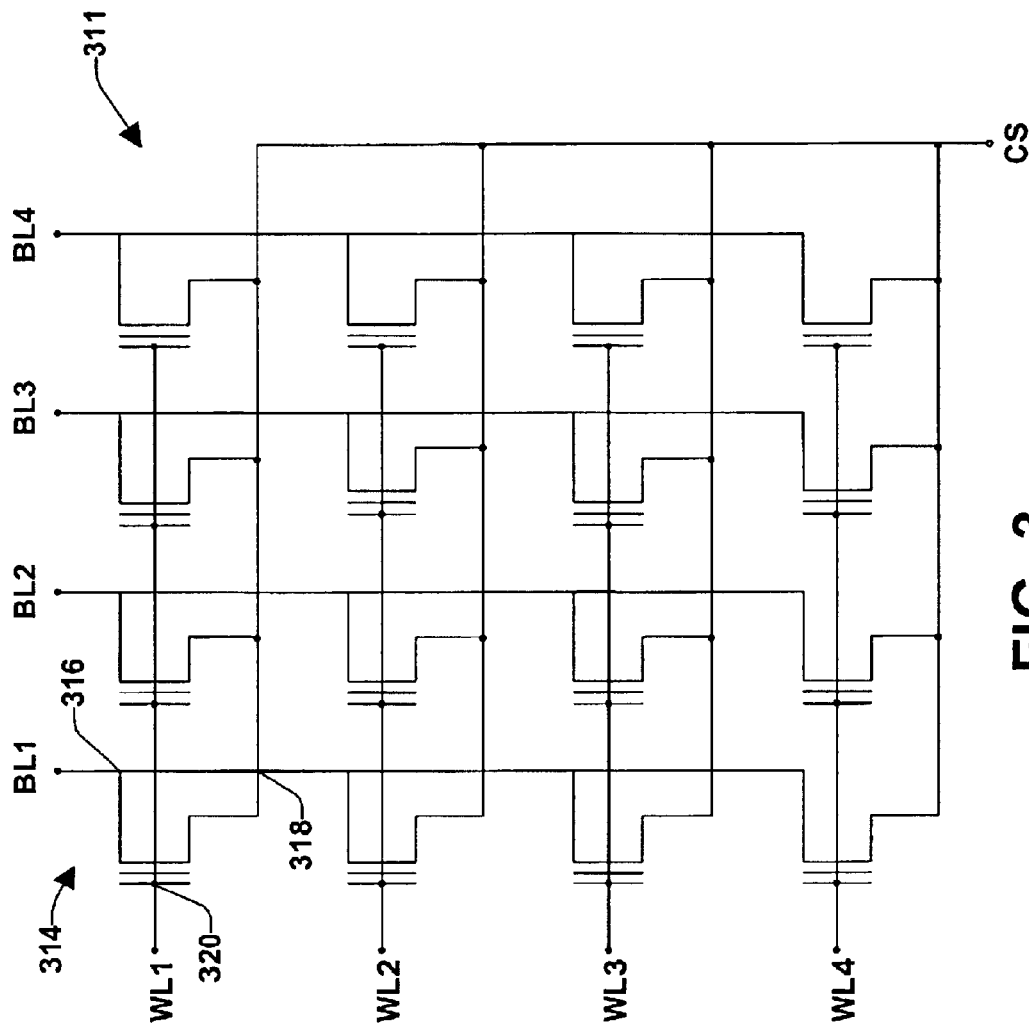
FIG. 3 is a diagram of a NOR configuration for a flash memory device in accordance with an aspect of the present invention.

FIG. 3 is a schematic diagram illustrating a NOR configuration 311 for the flash memory device 210 of FIG. 2. The NOR configuration 311 illustrated in FIG. 3 has each drain terminal 316 of memory cells 314 within a single column connected to the same bit line (BL). In addition, each flash cell 314 in a given column has its control gate coupled to a different word line (WL) while all the flash cells in the array have their source terminals 318 coupled to a common source terminal (CS). In operation, individual flash cells 314 may be individually addressed via the respective bit line and word line using peripheral decoder and control circuitry (not shown) for programming (writing), reading or erasing functions. Control gates 320 for a row of memory cells share a common word line (WL).

A channel erase, as discussed supra, can be applied to a row of memory cells all at once. In order to do so, a negative voltage is applied to the WL, which is connected to the respective control gates and a positive voltage is applied to a substrate or contact which connects to the respective p-type wells. By application of the negative voltage and the positive voltage, the entire row can be erased in one step/action. Since all the memory cells in a given sector may share the same p-well, by biasing all the word lines concurrently, the entire sector can be erased together.

Figure 4:
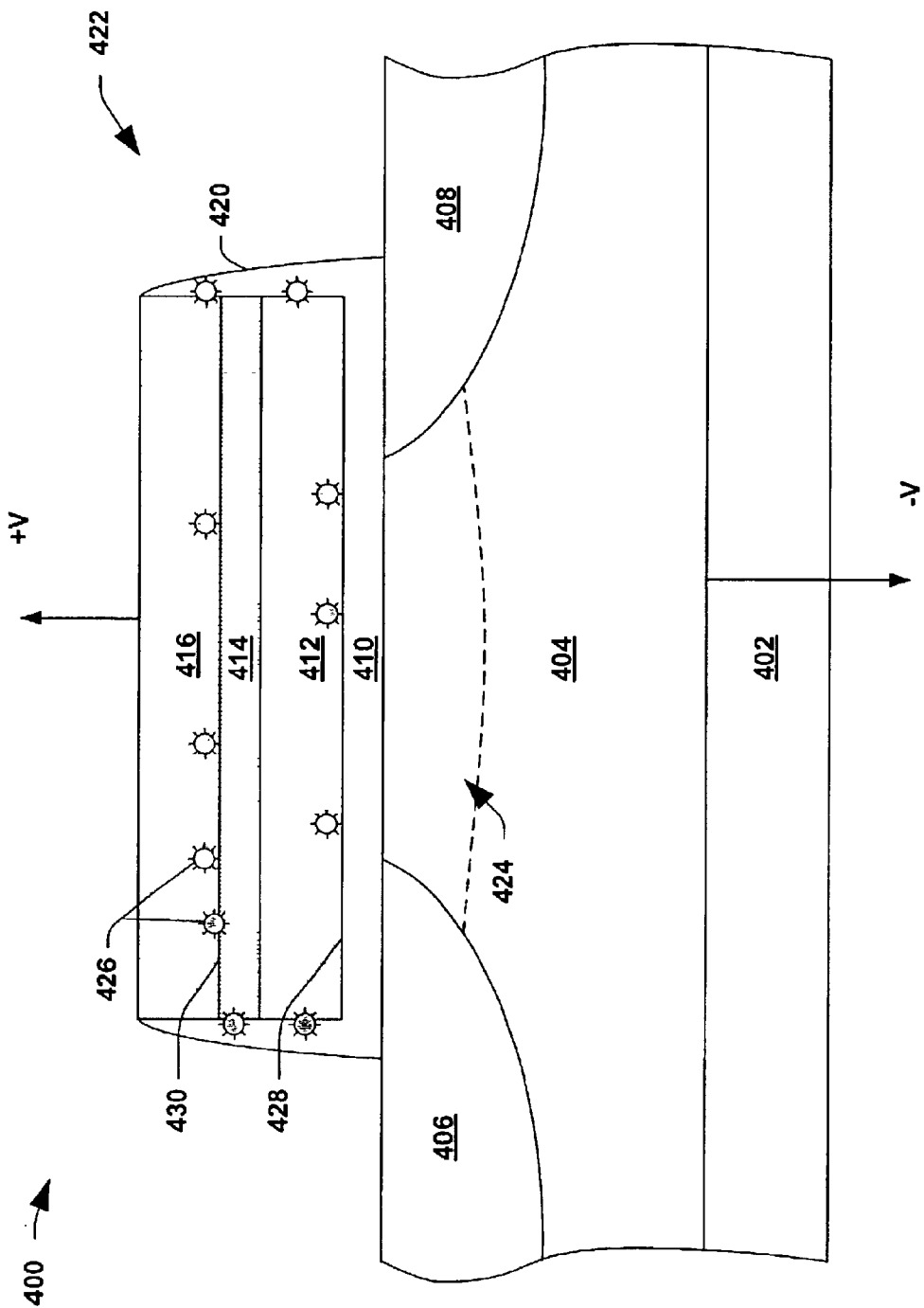
FIG. 4 is a cross sectional view of a flash memory cell at a first stage of a high voltage stress test in accordance with an aspect of the present invention.

FIG. 4 is a cross section of a flash memory cell 400 in accordance with an aspect of the invention at a first stage of a high voltage stress test. The flash memory cell 400 is depicted with a number of exemplary extrinsic defects 426 that have been identified. It is, appreciated that a memory cell may or may not have extrinsic defects and still be in accordance with the present invention.

A p-type well 404 is formed in a lightly doped n-type or p-type substrate 402 by doping or implanting a p-type dopant such as boron. Active regions, a source 406 and a drain 408, are formed within the p-type well 404 by selectively doping or implanting an n-type dopant, such as, antimony, arsenic, and/or phosphorous. The formed active regions 406 and 408 are n-type regions, having n-type conductivity and serve as source and drain and have a higher dopant concentration than the p-type well 404.

A tunnel oxide 410 is formed over the substrate 402 and on at least a portion of the p-type well 404 and the active regions 406 and 408 via a suitable oxide deposition or growth process. The tunnel oxide 410 is formed so as to be a relatively thin oxide layer and is commonly referred to as a tunnel oxide layer. A floating gate 412 is formed on the tunnel oxide 410 and is comprised, for example, of polysilicon. An interlayer dielectric layer 414 is formed on the floating gate 412 to electrically isolate the floating gate 412. The interlayer dielectric layer 414 is typically comprised of an oxide-nitride-oxide (ONO) layer having two oxide layers sandwiching a nitride layer. A control gate 416 is formed on the interlayer dielectric layer 414 and also comprises polysilicon. The tunnel oxide 410, the floating gate 412, the interlayer dielectric layer 414, and the control gate 416 collectively define a stacked structure 422, also referred to as a gate structure. Sidewall spacers 420 are formed on sidewalls of the stacked structure 422. As a result of the above configuration of the memory cell 400, a channel region 424 is located within the p-type well 104.

A relatively high voltage, meaning a voltage greater than a standard channel erase voltage, is applied across the control gate 416 and the p-type well 404 and/or the channel region 424 in order to stress the stacked structure 422. The high voltage is applied by applying a positive voltage (e.g., 10 volts) to the control gate 416 and by applying a negative voltage (e.g., −10 volts) to the p-type well 404 for a specific duration (e.g., about 100 to 500 milliseconds). The high voltage does not necessarily need to be much higher than the channel erase voltage because the extra voltage produces an exponential amount of stress on the stacked structure 422. For example, a high voltage that is merely 1 to 2 volts greater than the standard channel erase voltage for the memory cell 400 can be enough to greatly stress the stacked structure 422. It is appreciated that variations in mechanisms of applying the voltage are permitted in accordance with the present invention so long as the voltage is applied across the stacked structure 422 and/or the oxide layers (tunnel oxide, isolation oxide, and/or sidewall spacers).

Figure 5:
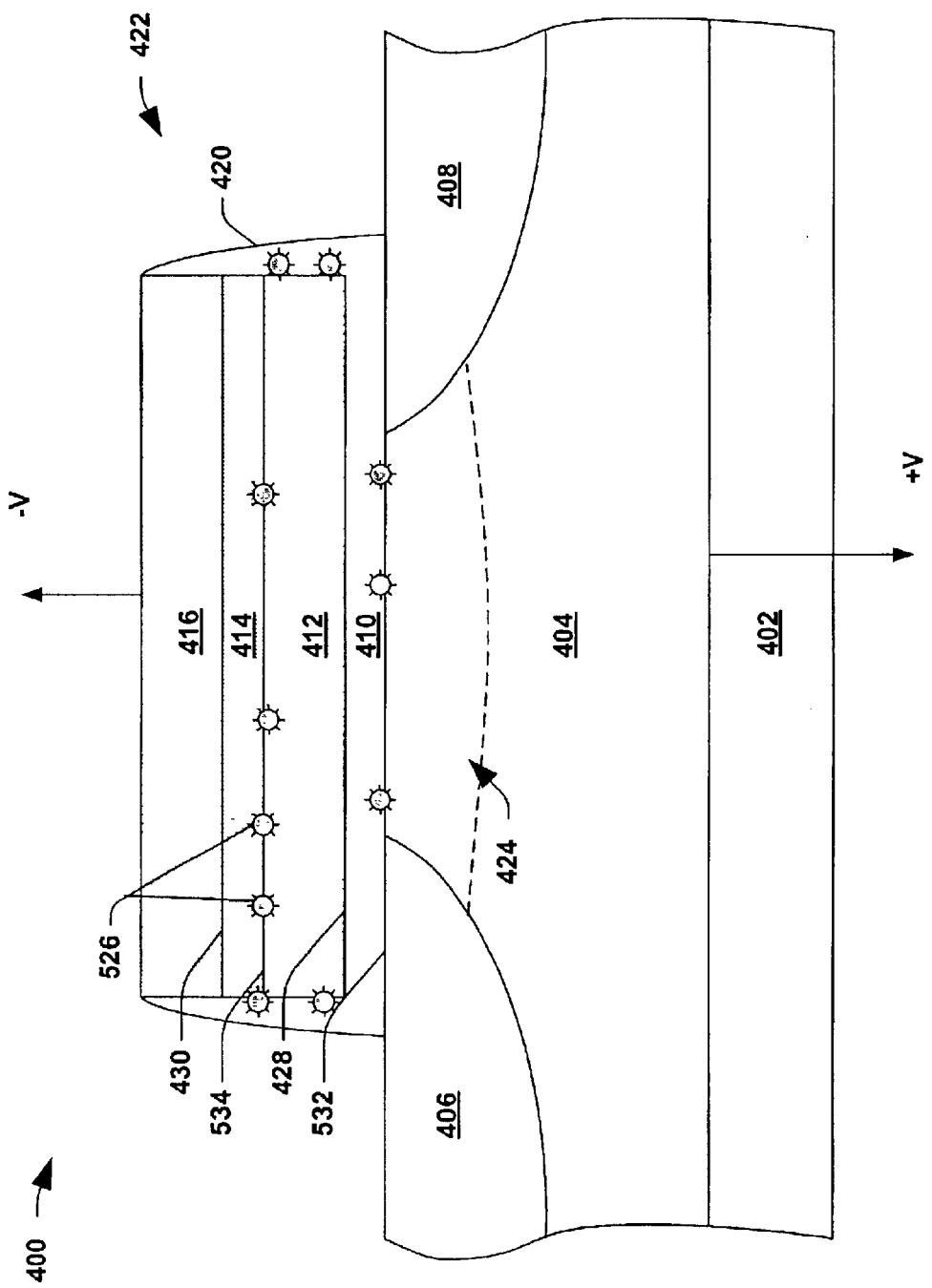
FIG. 5 is a cross sectional view of a flash memory cell at a next stage of a high voltage stress test in accordance with an aspect of the present invention.

With the positive voltage being applied to the control gate 416 and the negative voltage being applied to the p-type well 404, a number of defects 426 can be present in the stacked structure. The defects 426 are amplified extrinsic and/or process induced defects and are shown for illustrative purposes only. It is possible that, at this stage and other stages of the high voltage stress test, more or less defects, including none, can be present and still be in accordance with the present invention. The location of the defects 426 illustrate that the defects 426 tend to be identified/amplified at an upper interface 428 of the tunnel oxide layer 410 and at an upper interface 430 of the interlayer dielectric layer 414. Therefore, the high voltage stress test of the present invention tends to exacerbate any existing process induced defects so that such defects may be identified, whereas otherwise such defects may be latent and not detected at test Continuing with FIG. 5, another cross sectional view of the memory cell 400 at a next stage of a high voltage stress test is depicted in accordance with an aspect of the present invention. At this stage of the stress test, the polarity of the applied high voltage is reversed. Thus, a negative voltage is applied to the control gate 416 and a positive voltage is applied to the p-type well 404 for a specific duration (e.g., about 100 to about 500 milliseconds). The result in amplified defects 526 appearing at a lower interface 532 of the tunnel oxide layer 410 and at a lower interface 534 of the isolation oxide 414. Thus, by stressing the gate stack 422 in both polarity directions, the defects that may be associated with primary interfaces are advantageously exacerbated for detection thereof.

As with the amplified defects 426 of FIG. 4, the amplified defects 526 serve to illustrate, but not limit, the present invention. The amplified defects may or may not be present in greater or less numbers and still be in accordance with the present invention.

Figure 6:
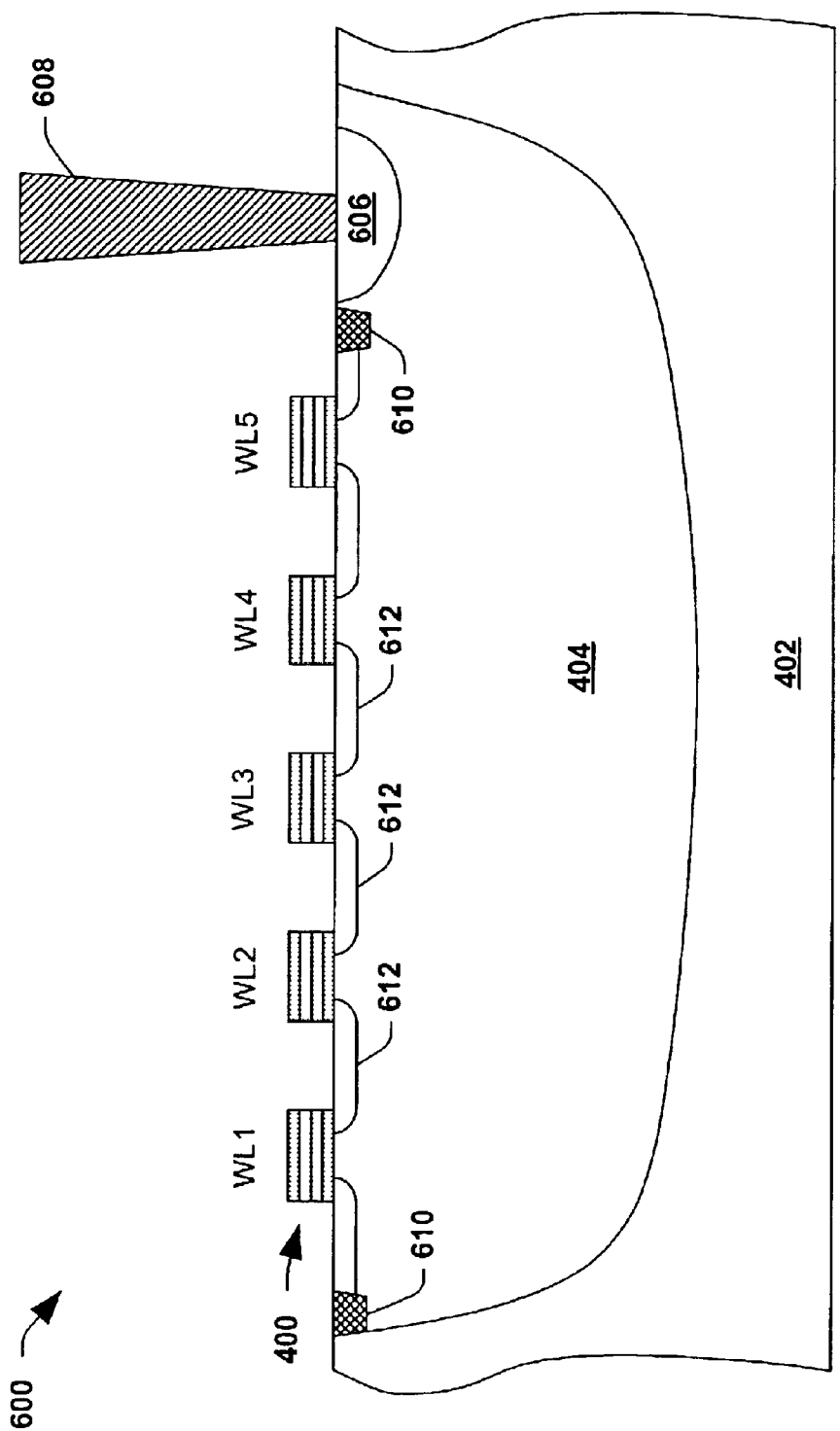
FIG. 6 is a cross sectional view of a flash memory device configured for a high voltage stress test in accordance with an aspect of the present invention.

Turning now to FIG. 6, a cross sectional view of a flash memory device 600 configured for a high stress test in accordance with an aspect of the present invention is illustrated. This particular view illustrates one of many suitable techniques for configuring a flash memory device 600 being subjected to a high voltage stress test in accordance with the present invention.

A p-type well 404 is located within a substrate 402, wherein the substrate 402 can be undoped, lightly doped p-type, or lightly doped. A high concentration p-type contact region 606 is located within the p-type well 404, and serves as a low resistance contact to the p-type well 404. A contact or plug 608 is located on and in contact with the low resistance contact 606. The contact 608 is comprised of a conductive material and serves to provide an applied voltage to the p-type well 404 through the low resistance contact 606. Active regions 612 are shown as being located near the surface of the p-type well and serve as source and drains for respective memory cells 400. Shallow trench isolation (STI) regions 610, for example, which are trenches filled with an oxide, serve to isolate the memory cells, specifically the active regions 612, from other portions of the device (not shown) and the low resistance contact 606.

As stated previously, a word line (WL) can be connected to a row of flash memory cells 400. Specifically, a word line is connected to control gates of the various memory cells 400. Each row (or all of the rows) of memory cells can undergo a high voltage stress test by applying a positive voltage to the respective word line (or word lines) and a negative voltage to the contact 608 for a period of time and then reverse polarity so as to apply the negative voltage to the word line(s) and the positive voltage to the contact 608. As stated supra, the high voltage applied is greater than a standard voltage applied to perform a channel erase.

Figure 7:
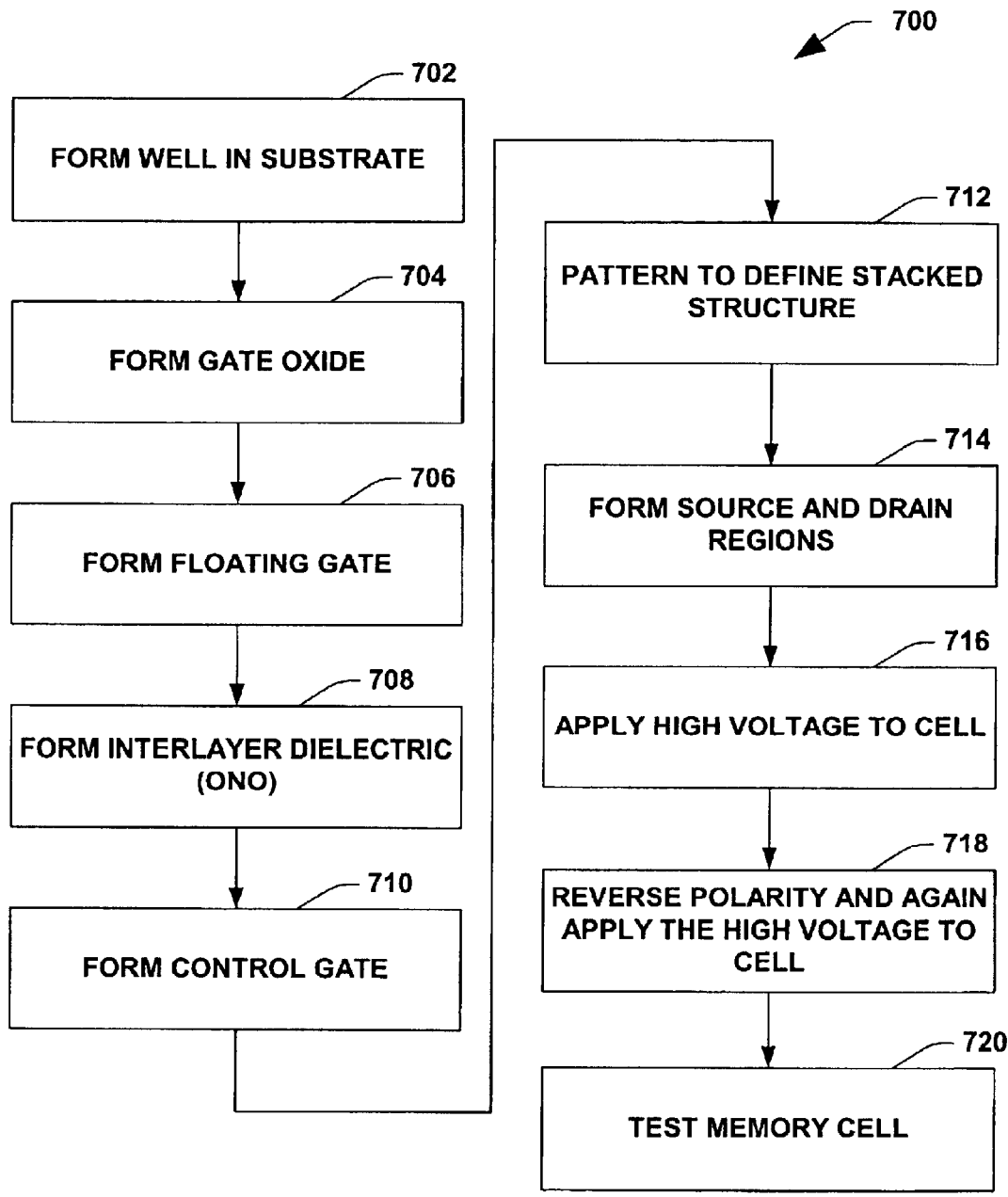
FIG. 7 is a flow diagram illustrating a method of fabricating a flash memory cell that incorporates a high voltage stress test in accordance with an aspect of the present invention.
Figure 8:
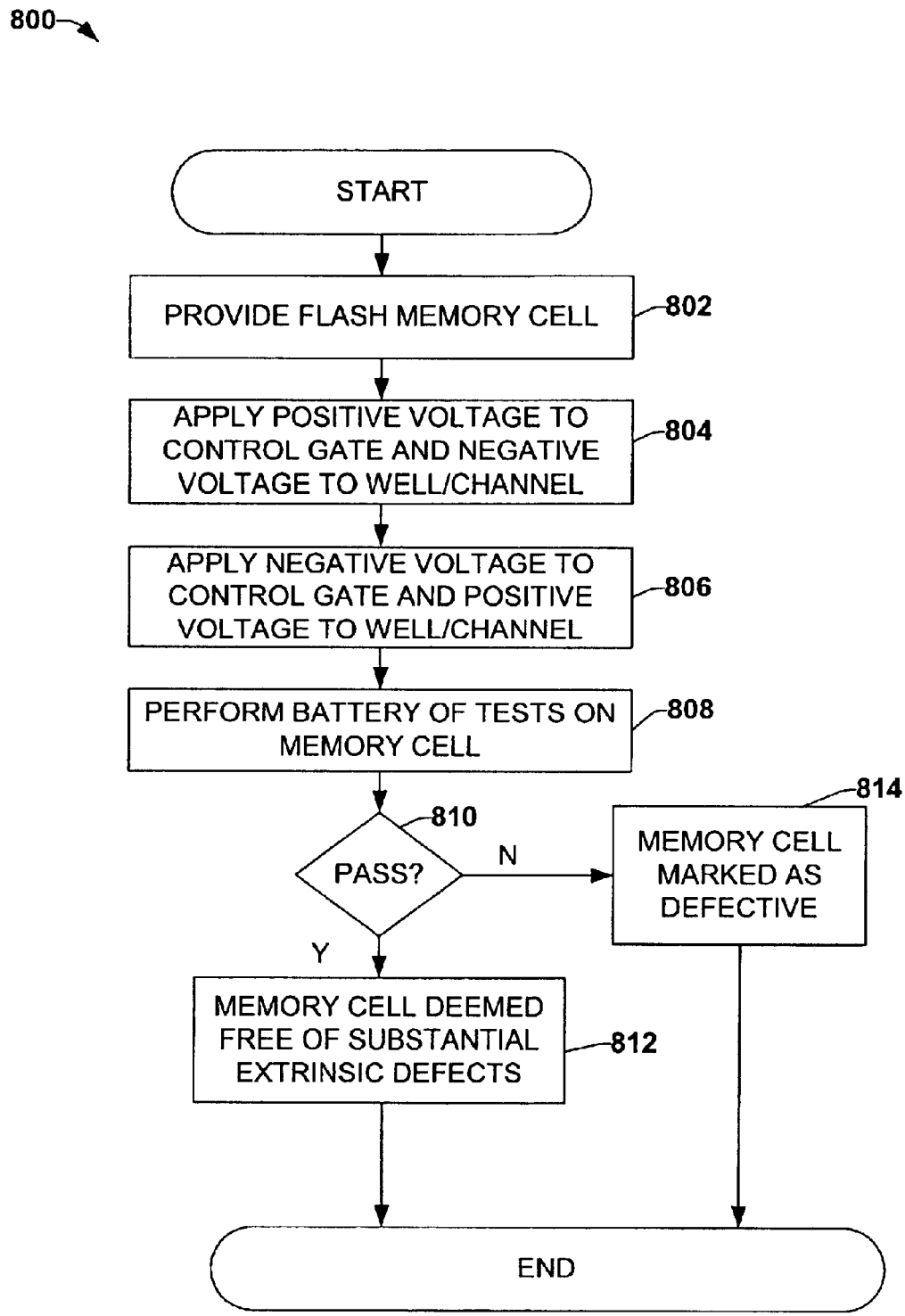
FIG. 8 is a flow diagram of a method of performing a high voltage stress test in accordance with an aspect of the present invention.

In view of the foregoing structural and functional features described supra, methodologies in accordance with various aspects of the present invention will be better appreciated with reference to FIGS. 7–8. While, for purposes of simplicity of explanation, the methodologies of FIGS. 7–8 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

FIG. 7 is a flow diagram that illustrates a method 700 of fabricating a flash memory cell, which incorporates a high voltage stress test, in accordance with an aspect of the present invention. It is appreciated that variations of the method, including additional processing steps/procedures, are contemplated and within the scope of the present invention. Additionally, the method 700 can be extended to semiconductor fabrication in general and still be in accordance with the present invention.

The method 700 begins at block 702, where a p-type well is formed within a substrate, wherein the substrate can be un-doped, lightly doped p-type, or lightly doped n-type. The p-type well is formed by doping a selected region with a p-type dopant such as boron. A masking procedure can be employed to facilitate the doping at blocks 702.

A tunnel oxide layer, also referred to as a gate oxide layer, is then formed on the p-type well at block 704 via a suitable oxide deposition or growth process. The tunnel oxide is formed so as to be a relatively thin oxide so that electrons can tunnel there through under appropriate biasing conditions. A floating gate comprised of polysilicon is formed on the tunnel oxide at block 706. An interlayer dielectric layer is then formed on the floating gate to electrically isolate the floating gate at block 708. The interlayer dielectric layer can be comprised of an oxide-nitride-oxide (ONO) layer having two oxide layers sandwiching a nitride layer. After forming the interlayer dielectric layer, a control gate, also comprised of polysilicon, is formed on the interlayer dielectric layer at block 710. A patterning operation is performed at block 712 that selectively removes portions of the previously deposited layers—the tunnel oxide, the floating gate, the interlayer dielectric layer, and the control gate thereby defining a stacked structure. As a result of the above configuration of the memory cell, a channel region is located within the p-type well near the surface. The channel region, during operation of the memory cell, permits current to flow from the source to the drain and also permits programming and erasing of the memory cell by facilitating adding and removing charge from the floating gate.

A source region and a drain region are formed at block 714 by selectively doping or implanting an n-type dopant, such as, antimony, arsenic, and phosphorous into exposed portions of the p-type well. The source/drain implant effectively utilizes the stacked structure as a mask for the implantation process. Additionally, this implantation results in self aligning the floating gate with the active regions (source and drain).

Turning now to block 716, a relatively high voltage is applied across the control gate and the p-type well of the memory cell for a period of time, such as, about 100 to 500 milliseconds, thereby amplifying extrinsic defects, if present. In some aspects of the present invention, a positive voltage is applied to the control gate and a negative voltage is applied to the p-type well or the channel region. In other aspects of the present invention, a negative voltage is applied to the control gate and a positive voltage is applied to the p-type well or the channel region. Continuing at block 718, a polarity of the relatively high voltage is reversed, thereby amplifying other extrinsic defects associated with the memory cells, if present. Finally, at block 720 the memory cell is tested to determine whether or not the memory cell is operable according to desired/required specifications. If the memory cell passes the test, it can be assumed that a substantial amount of extrinsic defects were not present. Otherwise, it can be assumed that substantial extrinsic defects were/are present in the memory cell and the memory cell and/or die can be marked as being defective.

Turning now to FIG. 8, a flow diagram of a method 800 of performing a high voltage stress test in accordance with an aspect of the present invention is provided.

The method 800 begins at block 802 wherein a flash memory cell having a source, drain, well region, channel region, tunnel oxide layer, floating gate, interlayer dielectric layer, control gate, and sidewall spacers is provided. The flash memory cell 100 of FIG. 1 is an example of a flash memory cell that can be employed in the method 800.

At block 804, a positive voltage is applied to the control gate and a negative voltage is applied to the channel region or the well region for a time period (e.g., about 100 to 500 milliseconds). The magnitude of the positive voltage and the negative voltage is greater than a channel erase voltage for the memory cell. The applied voltage causes extrinsic defects to be magnified or amplified along an upper interface of the interlayer dielectric layer, an upper interface of the tunnel oxide layer, and portions of the sidewall spacers. Generally, the higher the applied voltage, the higher the amount of stress placed on the memory cell. Additionally, the longer the time period, the more stress is placed on the memory cell. Continuing with block 806, the negative voltage is applied to the control gate and the positive voltage is applied to the channel region or the well region for another time period. It is appreciated that aspects of the present invention include utilizing different voltage values/magnitudes for block 806. The applied voltage causes additional extrinsic defects to be magnified or amplified along a lower interface of the interlayer dielectric layer, a lower interface of the tunnel oxide layer and other portions of the sidewall spacers.

At block 808, the memory cell undergoes a battery of tests to ensure proper operation of the memory cell. The battery of tests includes tests such as programming, reading, erasing, and the like. It is appreciated that the present invention includes performing only one such test and does not require multiple tests.

If the memory cell passes the battery of tests at 810, the memory cell is deemed to be substantially free of extrinsic defects at block 812. If the memory cell fails the battery of tests at 810, the memory cell is marked as being defective and having substantial extrinsic defects at block 814.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular to feature of the invention may have been disclosed with respect to only one of several embodiments, such feature may be combined with one or more other features of the other embodiments as may be desired and advantageous for any given or particular application.

What is claimed is:

1. A method of testing a flash memory cell for extrinsic defects comprising:

providing a flash memory cell having a stacked structure comprised of a tunnel oxide, a floating gate, an interlayer dielectric layer, and a control gate;

applying a voltage across the stacked structure of the flash memory by applying a voltage across the control gate and a p-type well of the memory cell thereby stressing the flash memory cell, the voltage being greater than a channel erase voltage for the flash memory cell; and testing the flash memory cell to identify whether extrinsic defects are present in the flash memory device.

2. The method of claim 1, wherein testing the flash memory cell comprises performing a plurality of tests.

3. The method of claim 1, wherein applying the voltage causes a further degradation of the identified extrinsic defects.

4. The method of claim 1, wherein applying the voltage across the stacked structure comprises applying a positive voltage to the control gate and a negative voltage to a p-well of the flash memory cell.

5. The method of claim 4, further comprising, prior to testing, applying the negative voltage to the control gate and the positive voltage to the p-well of the flash memory cell.

6. The method of claim 1, further comprising, prior to testing, switching a polarity of the applied voltage.

7. The method of claim 1, wherein applying the high voltage is performed for a duration of about 100 milliseconds or more and about 500 milliseconds or less.

8. The method of claim 1, wherein testing the flash memory cell comprises programming and reading the flash memory cell.

9. A method of screening flash memory cell for extrinsic defects comprising:

forming a plurality of flash memory cells;

applying a first high voltage across a p-well and a control gate of respective devices of the plurality of flash memory devices;

applying a second high voltage, opposite in polarity to the first high voltage, across the p-well and the control gate of respective devices of the plurality of flash memory devices;

performing a battery of tests on the plurality of flash memory devices; and indicating failed memory devices of the plurality of flash memory devices that fail the battery of tests.

10. The method of claim 9, wherein indicating the failed memory devices comprises marking each die corresponding to one of the failed memory devices.

11. The method of claim 9, wherein the battery of tests performed include programming, erasing, and reading.

12. The method of claim 9, wherein the first high voltage and the second high voltage have a magnitude of about 20 volts.

13. A method of fabricating a flash memory cell comprising:

providing a lightly doped substrate;

forming a p-type well in the substrate;

forming a source region and a drain region in the p-type well and defining a channel region between the source region and the drain region;

forming a tunnel oxide layer over the substrate on a surface of at least a portion of the source region, the p-type well, and the drain region;

forming a floating gate on the tunnel oxide layer;

forming an interlayer dielectric layer on the floating gate layer;

forming a control gate layer on the interlayer dielectric layer;

patterning the thin tunnel oxide, the floating gate layer, the interlayer dielectric layer, and the control gate, therein defining a stacked structure;

performing a high voltage stress test on the stacked structure; and determining if substantial extrinsic defects are present in the stacked structure.

14. The method of claim 13, wherein the high voltage stress test employs a voltage greater than a channel erase voltage.

15. The method of claim 14, wherein the channel erase voltage has a magnitude of about 18 volts and the voltage employed for the high voltage stress test has a magnitude of about 20 volts.

16. The method of claim 13, wherein performing the high voltage stress test comprises:

applying a positive voltage to the control gate and a negative voltage to the channel region; and subsequently, applying the negative voltage to the control gate and the positive voltage to the channel region.

17. The method of claim 13, further comprising forming sidewall spacers on the stacked structure prior to performing the high voltage stress test.

18. The method of claim 13, wherein determining if substantial extrinsic defects are present in the stacked structure comprises:

programming data to the memory cell;

reading data from the memory cell; and determining if the read data is identical to the programmed data.

19. The method of claim 18, further comprising waiting a period of time after programming data to the memory cell and prior to reading data from the memory cell.

20. The method of claim 13, wherein determining if substantial extrinsic defects are present in the stacked structure comprises performing a channel erase by applying a channel erase voltage across the channel region and the control gate and then reading the memory cell to determine if the memory cell has been erased.

21. The method of claim 13, wherein forming the interlayer dielectric layer comprises forming an oxide-nitride-oxide (ONO) layer.

22. The method of claim 13, wherein the control gate comprises polysilicon.

* * * * *